US012713532B2

(12) United States Patent
Ilg et al.

(10) Patent No.: US 12,713,532 B2
(45) Date of Patent: Aug. 18, 2026

(54) FIELD DEVICE AND METHOD FOR COMPACT ARRANGEMENT OF ELECTRONIC ASSEMBLIES OF AN ELECTRONIC CIRCUIT

(71) Applicant: VEGA Grieshaber KG, Wolfach (DE)

(72) Inventors: Thomas Ilg, Haslach (DE); Marius Isenmann, Biberach (DE)

(73) Assignee: VEGA Grieshaber KG, Wolfach (DE)

( * ) Notice: Subject to any disclaimer, the term of this patent is extended or adjusted under 35 U.S.C. 154(b) by 0 days.

(21) Appl. No.: 18/491,356

(22) Filed: Oct. 20, 2023

(65) Prior Publication Data

US 2024/0138067 A1 Apr. 25, 2024
US 2024/0237212 A9 Jul. 11, 2024

(30) Foreign Application Priority Data

Oct. 21, 2022 (DE) ..................... 10 2022 127 941.3

(51) Int. Cl.
*H05K 1/14* (2006.01)

(52) U.S. Cl.
CPC ............. *H05K 1/144* (2013.01); *H05K 1/148* (2013.01); *H05K 2201/042* (2013.01); *H05K 2201/048* (2013.01); *H05K 2201/10098* (2013.01)

(58) Field of Classification Search
CPC .... H01R 12/737; H01R 12/716; H01R 12/52; H01R 12/57; H05K 3/366; H05K 2201/10303; H05K 1/117
See application file for complete search history.

(56) References Cited

U.S. PATENT DOCUMENTS 5,525,763 A * 6/1996 Van Liere ............ H05K 3/0052 174/265
6,079,986 A * 6/2000 Beshears ................ H01R 12/52 439/63
6,780,028 B1 * 8/2004 Kennedy ................ H05K 3/366 439/876
7,077,658 B1 * 7/2006 Ashman ............... H01R 12/523 439/65
9,913,387 B1 3/2018 Muttam et al.
2006/0148280 A1 * 7/2006 Ashman ............... H01R 12/523 439/65
2008/0024115 A1 * 1/2008 Makinson ............ G01R 22/065 439/517

(Continued)

FOREIGN PATENT DOCUMENTS

DE 20 2011 101 629 U1 10/2012
DE 10 2012 103 217 B3 8/2013
WO WO-2009043649 A2 * 4/2009 ............. H05K 3/366

OTHER PUBLICATIONS

German Office Action issued Jun. 28, 2023 in German Application No. 10 2022 127 941.3, 9 pgs.

*Primary Examiner* — Paresh Paghadal
(74) *Attorney, Agent, or Firm* — Oblon, McClelland, Maier & Neustadt, L.L.P.

(57) ABSTRACT

A field device for process automation in industrial or private environments, comprising an electronic circuit for controlling the field device, wherein the electronic circuit includes a first, a second and a third circuit board. The first circuit board is connected to and attached to the second circuit board and/or to the third circuit board by way of an electrical connector, wherein the second circuit board is located above the third circuit board.

13 Claims, 2 Drawing Sheets

(56) References Cited

U.S. PATENT DOCUMENTS

| | | | | |
|---|---|---|---|---|
| 2013/0286622 | A1* | 10/2013 | Obara | H05K 1/0296 29/830 |
| 2016/0013570 | A1* | 1/2016 | Fry, Jr. | H01R 12/7076 29/842 |
| 2017/0019997 | A1* | 1/2017 | Boudreaux | H05K 3/366 |
| 2021/0307167 | A1* | 9/2021 | Schimmoeller | H05K 3/366 |
| 2022/0069501 | A1* | 3/2022 | Fujimura | H05K 1/144 |
| 2023/0006392 | A1* | 1/2023 | Jost | H01R 12/737 |
| 2023/0123068 | A1* | 4/2023 | Hsieh | H05K 1/144 361/749 |
| 2024/0237193 | A1* | 7/2024 | Huang | H05K 3/366 |

* cited by examiner

FIELD DEVICE AND METHOD FOR COMPACT ARRANGEMENT OF ELECTRONIC ASSEMBLIES OF AN ELECTRONIC CIRCUIT

CROSS-REFERENCE TO RELATED APPLICATIONS

This application claims the benefit of the filing date of German Patent Application No. 10 2022 127 941.3 filed on 21 Oct. 2022, the entire content of which is incorporated herein by reference.

BACKGROUND

Field

A field device for process automation in industrial or private environments and a method for compact arrangement of electronic assemblies of an electronic circuit of a field device.

Description of Related Art

In process automation in industrial or private environments, field devices are used which are configured to record process measured variables such as level, flow, temperature or pressure. These field devices have an electronic circuit that is configured to control the field device. This usually has one or more printed circuit boards, which are arranged parallel to one another and are electrically connected to one another.

SUMMARY

There may be a desire to provide a field device comprising an alternative electronic circuit.

This desire is met by the features of the independent patent claims. Further embodiments of the present disclosure result from the subclaims of the following description.

A first aspect of the present disclosure relates to a field device for process automation in an industrial or residential environment, comprising an electronic circuit configured to control the field device.

The electronic circuit has at least a first printed circuit board, a second printed circuit board, and a third printed circuit board. The first printed circuit board is connected to the second printed circuit board and/or to the third printed circuit board by means of one or more electrical plug connections and is attached thereto. Here, the second printed circuit board is located above the third printed circuit board. “Above” may mean, for example, “on the side facing away from the process”. Also, an arrangement may be provided which is constructed as a mirror image of the arrangement of printed circuit boards described above.

The printed circuit boards can be connected to each other via pin and connector strips (electrical plug connection). If no electrical plug connection is provided, flat ribbon cables or directly connecting flex conductors, semiflex or the like can be used to electrically connect the circuit boards. Right-angled pin and connector strips can also be used, which allow another PCB to be placed at a 90-degree angle on each location of the PCB.

The electronic circuitry provided in the field device enables a compact arrangement of electronic assemblies while saving electrical contacts, for example, a ribbon cable.

According to an embodiment, the second printed circuit board and the third printed circuit board are arranged parallel to each other. This reduces overall height.

According to a further embodiment, the first printed circuit board and the second printed circuit board are arranged without gaps and/or perpendicular to each other. The gap-free arrangement also saves installation space and can increase mechanical stability.

According to a further embodiment, the first printed circuit board is attached to the second printed circuit board and/or the third printed circuit board exclusively by means of the electrical plug connection. In the case of attachment of the first printed circuit board to both the second and the third printed circuit board, two plug-in connections may be provided.

According to another embodiment, the electrical connector comprises at least one male connector and at least one female connector, wherein the male connector is attached to the first circuit board (or to the second circuit board or to the third circuit board) and the female connector is attached to the second circuit board (or to the third circuit board or to the first and the third or to the first and the second).

According to another embodiment, the second circuit board has a feedthrough through which the pins of the connector are passed in order to be inserted into the socket arranged behind it (i.e., on the other side of the second circuit board).

According to another embodiment, the first printed circuit board has a radio module.

According to another embodiment, the second circuit board has a power supply and/or the third circuit board has a main processor.

According to a further embodiment, at least a fourth printed circuit board is provided, which is arranged below the third printed circuit board and parallel thereto.

According to a further embodiment, the fourth printed circuit board has the sensor technology of the field device. However, the sensor technology can also be accommodated in the third circuit board.

According to a further embodiment, the second circuit board and the third circuit board are electrically connected to each other via a cable connection and/or a plug connection. Likewise, the third and the fourth printed circuit board can be electrically connected to each other via a further cable connection.

According to a further embodiment, the first printed circuit board and the second printed circuit board and/or the first printed circuit board and the third printed circuit board are electrically connected to each other exclusively via the electrical plug connection. An additional cable connection is not provided.

According to another embodiment, the field device is a level meter, a point level sensor, a flow meter, or a pressure sensor.

According to a further embodiment, the field device is a self-sufficient, wirelessly deployable field device that has its own power supply and is not connected via a cable to an external device or a bus network.

Another aspect of the present disclosure relates to a method for compactly arranging electrical assemblies of an electronic circuit of a field device, the electronic circuit comprising at least a first circuit board, a second circuit board, and a third circuit board. In the method, a second circuit board is electrically connected to a third circuit board by means of a cable connection. The second circuit board is arranged parallel to the third circuit board. A first printed circuit board is arranged above the second printed circuit board. In this arrangement, electrical connection of the first printed circuit board to the second printed circuit board and/or to the third printed circuit board is made by means of one or more electrical connectors.

In the following, embodiments of the present disclosure are described with reference to the figures. The representations in the figures are schematic and not to scale. If the same reference signs are used in the following description of figures, these describe the same or similar elements.

DETAILED DESCRIPTION OF EMBODIMENTS

Figure 1:
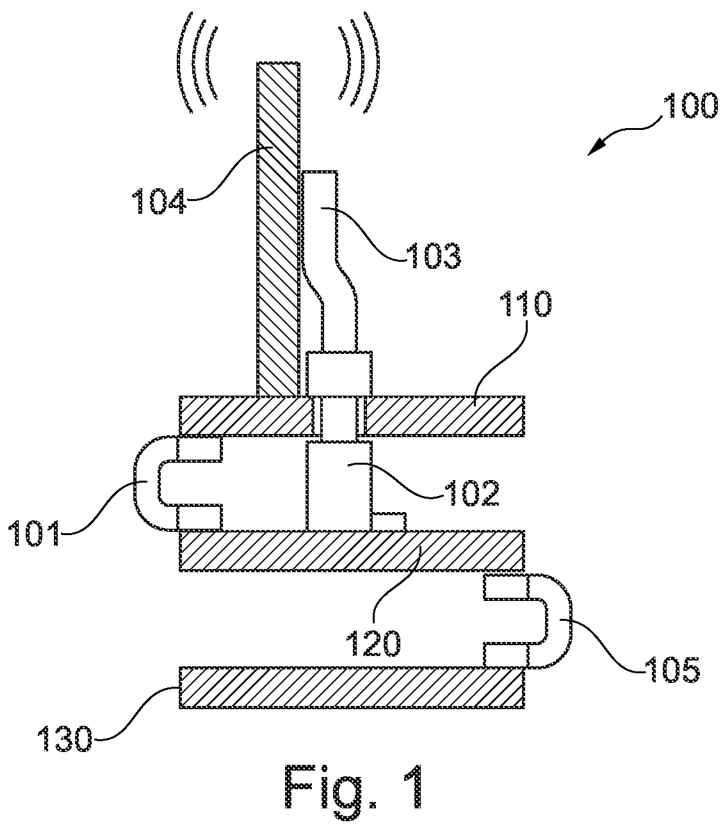
FIG. 1 shows an electronic circuit of a field device according to an embodiment.

FIG. 1 shows an electronic circuit 100 of a field device typically set up and used for process automation in industrial and/or residential environments. The electronic circuit has at least a first printed circuit board 104, a second printed circuit board 110 and a third printed circuit board 120. In the embodiment of FIG. 1, a fourth printed circuit board 130 is also provided. Additional circuit boards may also be provided.

The first circuit board 104 is connected to and attached to the second circuit board 110 by means of an electrical connector 102, 103. The electrical connector 102, 103 shown in FIG. 1 has a plug 103 attached to the first circuit board 104 and a socket 102 attached to the third circuit board. The plug 103 is inserted into the socket 102 and extends through a recess in the second circuit board 110. A ridge of the plug 103 may rest on the upper face of the second circuit board 110 in this regard. Likewise, the lower end face of the first printed circuit board 104 rests on the upper side of the second printed circuit board 110, so that the first printed circuit board 104/second printed circuit board 110 arrangement is gap-free.

Socket 102 and plug 103 can also be arranged the other way round, i.e., that socket 102 is connected to or attached to first printed circuit board 104 and plug 103 is attached to third printed circuit board so that it penetrates second printed circuit board 110 from below. Mechanically, this is particularly possible if the ribbon cable 101 is arranged far enough away from the penetration point of the printed circuit board 110.

Also, it may be provided that the socket 102 is attached to the fourth circuit board 130, so that in this case two recesses are provided, one in the second circuit board 110 and a second in the third circuit board 120, which are penetrated by the plug.

Two connectors may also be provided, one for connecting the first circuit board to the third circuit board and a second for connecting the first circuit board to the second circuit board or the fourth circuit board.

The electronic circuit 100 can be the main electronics of a level sensor, which has an additional communication module (radio module), via which the main electronics can be parameterized and thus set.

The radio module can have the Bluetooth standard or use another radio standard, such as LoRa, WLAN, and Zigbee.

For example, the electronic circuit 100 comprises three or more circuit boards 110, 120, 130 and the circuit board for the communication module 104. Multiple circuit boards 104 may also be provided. The communication module may be designed as a radio module. However, it may also be designed as a cable-bound communication module.

It is also possible, for example, to have an illuminated display ("communication module" to the human).

Thus a LED can be provided, in order to give feedback to the customer.

In the embodiment of FIG. 1, the electrical contact between the first printed circuit board 104 and the third printed circuit board 120 is made solely by means of the electrical connector 102, 103. The electrical connection between the second printed circuit board 110 and the third printed circuit board 120 is made via a ribbon cable 101 or a corresponding line arrangement, such as a pin header. The electrical connection between the third printed circuit board 120 and the fourth printed circuit board 130 is also made via a flat ribbon line 105 or a corresponding conductive arrangement.

The cable arrangement 101 is provided on one side of the electronic circuit and the second lead arrangement 105 is provided on the opposite side.

The communication module provided by the first circuit board 104 is thus positioned upright on the second circuit board 110, for example at a 90 degree angle thereto. In this way, lateral radiation of the communication signal is facilitated.

In order to provide sufficient space for the other components of the main electronics, these have been distributed over several printed circuit boards 110, 120, 130 arranged one above the other, which are connected to each other via cable connections 101, 105, for example in the form of ribbon cables. Further printed circuit boards may also be provided underneath.

Access to the electronic circuit 100 is from the top. Due to the arrangement of the electronic components from top to bottom, it may be advantageous to place the power supply on the second circuit board 110 and the main processor on the third circuit board 120. On the fourth circuit board 130, the sensor technology of the field device may be arranged in this example.

The communication module (first PCB 104) is connected in a direct way to the main electronics, in particular to the main processor located on the third PCB 120.

If the communication module 104 is connected to the second printed circuit board 110 or the fourth printed circuit board 130, additional connections may be made via the ribbon cables 101 and 105, respectively.

There is also another aspect: If PCBs are mounted at right angles on other PCBs and electrically connected, this can hardly be done without a gap. The reason for this is that the protruding pin strip requires a socket on the opposite side. If the gap is to be dispensed with, a larger area must be reserved on the plugged-in PCB.

To avoid both of these problems, the pins of the connector of the circuit board 104 to be inserted are passed through the second circuit board 110 and mounted on the circuit board 120 below.

This design saves contacts on the ribbon cable, which is advantageous for making it as narrow as possible. It also ensures that the electrical contacts do not have to be routed via the connecting ribbon cable or a pin strip connecting the two printed circuit boards 110 and 120, and the electrical cable length is therefore shorter.

This arrangement saves 110 overall height due to the absence of gaps and the "push-through" of the pin header through the printed circuit board. Contacts on the compartment tape line are also reduced. The communication module 104 is arranged perpendicularly above the main circuit board (second circuit board 110). A parallel arrangement is also possible.

The field device may be arranged to allow freestanding omnidirectional transmission by the communication module 104. For example, this is made possible by arranging the first circuit board 104 perpendicular to the second circuit board 110. The entire contact and plunge point of the electrical connector 102, 103 may be potted, also to prevent corrosion and unwanted conduction of current through the circuit boards.

In the embodiment of FIG. 1, gaps between the first printed circuit board 104, 110 are avoided and due to the 90 degree arrangement, the radio signal can (also) be radiated laterally. Furthermore, contacts of the ribbon cables are reduced.

FIG. 1 shows a good overview of the entire mechanical structure of the electronic circuit 100 with the main electronics distributed on three printed circuit boards 110, 120, 130, the connecting ribbon cables 101, 105, and the communication module (first printed circuit board 104) with the plug-in connection 102, 103 to the main electronics.

Figure 2:
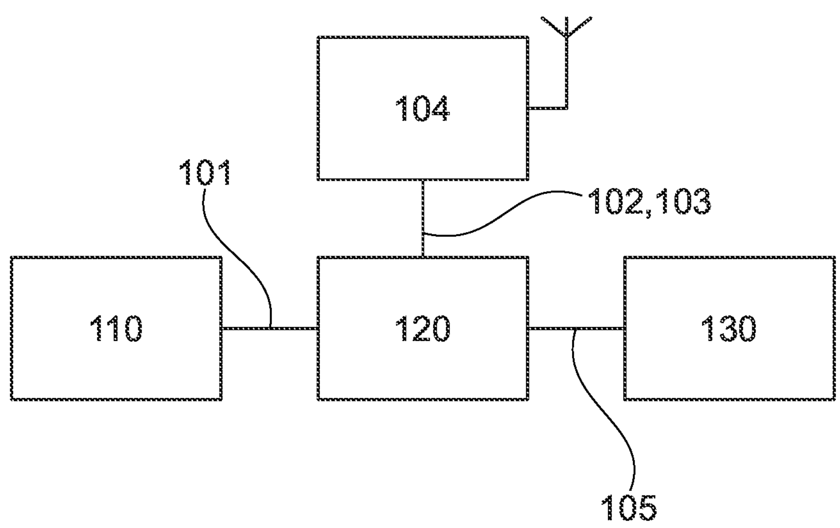
FIG. 2 shows the interconnection of the individual units of an electronic circuit according to an embodiment.

FIG. 2 shows a logical overview of the electrical connections of the arrangement described in FIG. 1. The first circuit board 104 is connected to the third circuit board 120 via the electrical connector 102, 103. The third circuit board is connected to the second circuit board 110 via the cable connection 101 and to the fourth circuit board 130 via the cable connection 105. The cable connections 101, 105 may be of flexible, bendable design.

Figures 3A, 3B, 3C, 4A, 4B, 4C, 5, 6:
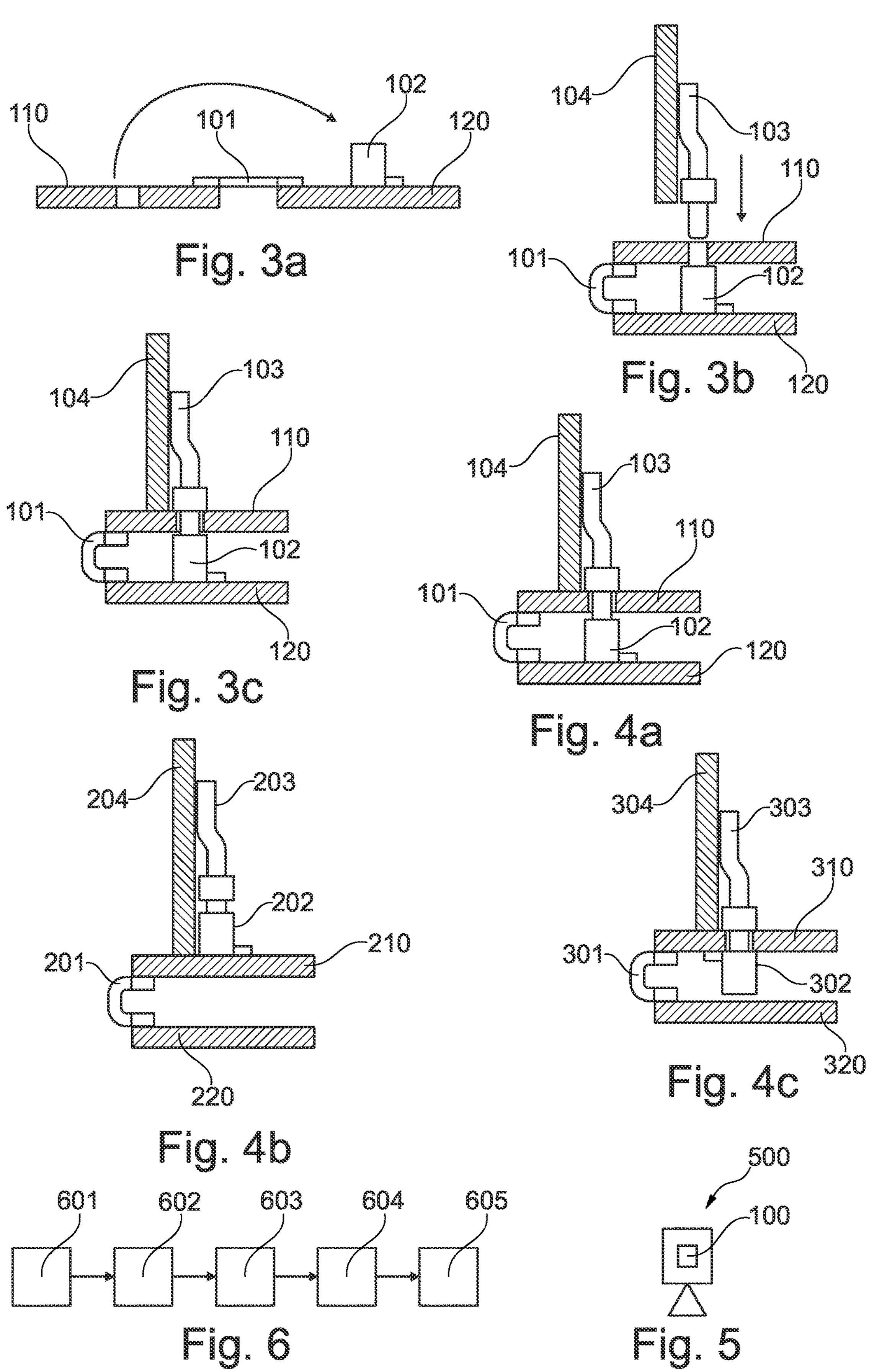
FIG. 3*a*, FIG. 3*b* and FIG. 3*c* show individual steps of a process according to an embodiment.
FIG. 4*a*, FIG. 4*b* and FIG. 4*c* show three embodiments of an electronic circuit.
FIG. 5 shows an example of a field device with an electronic circuit according to an embodiment.
FIG. 6 shows a flow diagram of a process according to an embodiment.

FIGS. 3*a*, 3*b* and 3*c* show an example of the assembly of the electronic circuit 100. The two printed circuit boards 110, 120 are connected to each other via the cable connection 101 and are initially arranged on the same plane (FIG. 3*a*). This arrangement is then "folded" by folding the printed circuit board 110 upward, in the direction of the arrow. A bushing 102 is disposed on the printed circuit board 120. For example, the printed circuit board 110 rests on the bushing after the folding process (FIG. 3*b*). However, a gap may also be provided. Subsequently, the plug 103 of the printed circuit board 104 is passed from above with its pin strip through the recess in the printed circuit board 110 and inserted into the socket 102 of the printed circuit board 120. This results in a compact assembly (see FIG. 3*c*). Not shown is the printed circuit board 130 and any further printed circuit boards that may be provided.

FIGS. 4*a* to 4*c* show various methods for connecting two printed circuit boards at a 90 degree angle. Not shown are other circuit boards that may be provided, such as circuit board 130.

The printed circuit boards shown in FIGS. 4*a* to 4*c* may be identically or similarly populated. This is to be understood to mean that the printed circuit board 104 may be similarly or identically populated as the printed circuit boards 204, 304, that the printed circuit board 110 may be similarly or identically populated as the printed circuit boards 210, 310, and that the printed circuit board 120 may be similarly or identically populated as the printed circuit boards 220, 320.

In the embodiment of FIG. 4*a*, the socket 102 is assembled directly onto the printed circuit board 120. Additional contacts via the ribbon cable 101 are omitted.

In FIG. 4*b*, the electrical connection is made through the female connector 202 on the PCB 210 (i.e., the second PCB), which is fitted at the top, and male connector 203 on the first PCB 204, which is pulled up. Additional lines in the direction of PCB 220 (third PCB) can be routed via a ribbon cable 201. The pin header 203 requires additional space on the printed circuit board 204 compared to the embodiment of FIG. 4*a*.

In FIG. 4*c*, the connector socket 302 is assembled in reverse on the circuit board 310. The male connector 303 is inserted through the printed circuit board 310 into the female connector 302. Additional leads in the direction of the printed circuit board 320 can be routed through a ribbon cable 301 or a pin header.

The two PCBs 104, 110 or 204, 210 or 304, 310 can be soldered together, e.g., across the corner.

FIG. 5 shows a field device 500 with an electronic circuit 100 according to one embodiment. The field device is, for example, a level measuring device, in particular a level wheel arm measuring device, a point level sensor, a pressure measuring device or a flow measuring device.

The field device 500 includes a housing in which an electronics cup is located. The electronics cup houses the electronics circuit 100. The electronics cup, which may otherwise be part of the field device housing, holds the electronics circuit 100. In particular, lateral guides may be provided that guide the first circuit board 204 as it moves downwardly for insertion into the socket 102. In other words, the first circuit board 104 may be slidably disposed within the field device housing. In particular, it can be easily replaced or retrofitted in this manner.

At this point, it should be noted that it may also be provided that the first circuit board 104 is arranged horizontally, parallel to the second circuit board 110. In this arrangement, the connector 103 is not arranged parallel, but perpendicular to the first printed circuit board 104. This saves further installation space upwards.

FIG. 6 shows a flowchart of a method according to one embodiment. In step 601, a second printed circuit board 110 is electrically connected to a third printed circuit board 120 by means of a cable connection 101. Thereafter, the second circuit board 110 is flipped upward so that it is now positioned above and parallel to the third circuit board 120 (steps 601, 602). In step 603, a first printed circuit board 104 is arranged above the second printed circuit board 110, either parallel or perpendicular thereto, or at a different angle. These two circuit boards 104, 110 are now moved towards each other so that the plug 103 of the first circuit board 104 is inserted into the plug socket 102. In step 605 (this step can also take place before step 604), the electronic circuit 100 or, if this step takes place before step 604, the second printed circuit board 110 and the third printed circuit board 120 are inserted into the housing of the measuring instrument and fixed there. In the latter case, the first printed circuit board 204 can then be inserted from above.

The terms used in the claims should be construed to receive the broadest reasonable interpretation consistent with the foregoing description, particularly the term "printed circuit board." For example, the use of the article "a" or "the" in introducing an element should not be construed to exclude a plurality of elements. Similarly, the mention of "or" should be construed to include a plurality of elements, so that the mention of "A or B" does not exclude "A and B" unless it is clear from the context or preceding description that only one of A and B is meant. Further, the phrase "at least one of A, B, and C" should be understood to mean one or more of a group of elements consisting of A, B, and C, and should not be interpreted to require at least one of each of A, B, and C listed, whether A, B, and C are related as categories or otherwise. In addition, the reference to "A, B, and/or C" or "at least one of A, B, or C" should be construed to include any single unit of the listed elements, e.g., A, any subset of the listed elements, e.g., A and B, or the entire list of elements A, B, and C.

The invention claimed is:

1. A field device for process automation in industrial or private environments, comprising:

an electronic circuit configured to control the field device, wherein the electronic circuit includes a first circuit board, a second circuit board, and a third circuit board, wherein the first circuit board and the second circuit board are arranged without gaps and perpendicular to each other, wherein the first circuit board is connected to and attached to the third circuit board by way of an electrical connector, and wherein the first circuit board is located above the second circuit board, and the second circuit board is located above the third circuit board.

2. The field device according to claim 1, wherein the second circuit board and the third circuit board are arranged parallel to each other.

3. The field device according to claim 1, wherein the first circuit board is attached to the second circuit board and/or the third circuit board solely by way of the electrical connector.

4. The field device according to claim 1, wherein the first circuit board includes a radio module.

5. The field device according to claim 1, wherein the second circuit board includes a power supply, and/or wherein the third circuit board includes a main processor.

6. The field device according to claim 1, further comprising:

at least a fourth circuit board arranged below and parallel to the third circuit board.

7. The field device according to claim 6, wherein the fourth circuit board includes sensor technology of the field device.

8. The field device according to claim 1, wherein the second circuit board and the third circuit board are electrically connected to each other via a cable connection.

9. The field device according to claim 2, wherein the first circuit board and the second circuit board and/or the first circuit board and the third circuit board are electrically connected to each other exclusively via the electrical connector.

10. The field device according to claim 1, wherein the field device is a level meter, a point level sensor, a flow meter, or a pressure meter.

11. The field device according to claim 1, wherein the field device is a stand-alone wireless field device.

12. The field device according to claim 2, wherein the first circuit board is attached to the third circuit board solely by way of the electrical connector.

13. A method of compactly arranging electronic assemblies of an electronic circuit of a field device having at least a first circuit board, a second circuit board, and a third circuit board, comprising:

electrically connecting the second circuit board to the third circuit board by way of a cable connection;

arranging the second circuit board parallel to the third circuit board;

arranging the first circuit board above the second circuit board, and the second circuit board above the third circuit board; and electrically connecting the first circuit board to the third circuit board by way of an electrical connector, wherein the first circuit board and the second circuit board are arranged without gaps and perpendicular to each other.

* * * * *